(12) United States Patent
Inamasu et al.

(10) Patent No.: US 7,908,995 B2
(45) Date of Patent: Mar. 22, 2011

(54) STAGE APPARATUS AND APPLICATION PROCESSING APPARATUS

(75) Inventors: Toshifumi Inamasu, Koshi (JP); Tsuyoshi Yamasaki, Koshi (JP); Kazuhito Miyazaki, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 866 days.

(21) Appl. No.: 11/814,526

(22) PCT Filed: Jan. 19, 2006

(86) PCT No.: PCT/JP2006/300688
§ 371 (c)(1), (2), (4) Date: Jul. 23, 2007

(87) PCT Pub. No.: WO2006/077905
PCT Pub. Date: Jul. 27, 2006

(65) Prior Publication Data
US 2009/0047103 A1 Feb. 19, 2009

(30) Foreign Application Priority Data
Jan. 24, 2005 (JP) ................ 2005-015564

(51) Int. Cl.
*B05C 5/02* (2006.01)
*B05C 13/02* (2006.01)
(52) U.S. Cl. .......... 118/300; 118/305; 118/500; 34/640; 34/658; 406/86; 406/88; 414/676
(58) Field of Classification Search .................. 118/300, 118/305, 500; 198/689.1, 493, 817; 34/640, 34/658; 414/676; 406/86, 88
See application file for complete search history.

(56) References Cited

U.S. PATENT DOCUMENTS 6,781,684 B1 * 8/2004 Ekhoff ................ 356/237.1
7,604,439 B2 * 10/2009 Yassour et al. ............ 406/88

FOREIGN PATENT DOCUMENTS

| JP | 10 156255 | 6/1998 |
|----|-----------|--------|
| JP | 2000 191137 | 7/2000 |
| JP | 2002 181714 | 6/2002 |
| JP | 2003 279495 | 10/2003 |
| JP | 2004 44330 | 2/2004 |
| JP | 2004 218156 | 8/2004 |
| JP | 2005 223119 | 8/2005 |
| JP | 2005 244155 | 9/2005 |

* cited by examiner

Primary Examiner — Laura Edwards
(74) Attorney, Agent, or Firm — Oblon, Spivak, McClelland, Maier & Neustadt, L.L.P.

(57) ABSTRACT

A stage apparatus in which a rectangular substrate which is levitated over a stage is transferred such that a pair of sides of the rectangular substrate are substantially parallel to a transfer direction and the other pair of sides of the rectangular substrate are substantially perpendicular to the transfer direction. The stage includes a plurality of gas spray ports to spray a gas and a plurality of suction ports to attract the rectangular substrate by suction. The rectangular substrate is levitated at a predetermined height from the surface of the stage in a substantially horizontal posture by means of suction of a suction mechanism through the plurality of suction ports and gas spray of a gas spray mechanism through the plurality of gas spray ports. The plurality of suction ports are arranged on the stage such that, when the rectangular substrate is being transferred over the stage, the leading end of the rectangular substrate in the transfer direction does not simultaneously cover not less than a predetermined number of suction ports and the trailing end of the rectangular substrate in the transfer direction does not simultaneously open not less than a predetermined number of suction ports to the atmosphere, so as for variations in suction pressure in the suction ports to fall within an allowable range.

19 Claims, 7 Drawing Sheets

STAGE APPARATUS AND APPLICATION PROCESSING APPARATUS

TECHNICAL FIELD

The present invention relates to a stage apparatus used for transferring a substrate such as a glass substrate employed in an FPD (Flat Panel Display) such as a liquid crystal display device (LCD), and a coating system comprising the stage apparatus.

BACKGROUND ART

For example, in a manufacturing process for a liquid crystal display apparatus (LCD), a predetermined circuit pattern is formed on a glass substrate by using photolithography. More specifically, a resist liquid is supplied to the glass substrate to form a coating film. After drying and heat treating the coating film, a light exposure process and a developing process are successively performed.

As an apparatus that supplies a resist liquid to a glass substrate to form a coating film, there is known a coating film forming system (for example, see Patent Document 1) including a stage which vacuum chucks a glass substrate horizontally, a resist supply nozzle which supplies the resist liquid to the substrate held on the stage, and a moving mechanism which moves the stage and resist supply nozzle relative to each other in the horizontal direction.

When holding the glass substrate by vacuum chucking, however, suction holes formed on the stage tend to be printed onto the surface of the glass substrate, and many particles attach to the lower surface of the substrate. Since either the resist supply nozzle or the stage must be moved, the apparatus becomes bulky with a complicated structure and requires a high power cost.

Patent Document 1: Jpn. Pat. Appl. KOKAI Publication No 10-156255

DISCLOSURE OF INVENTION

It is an object of the present invention to provide a stage apparatus with a simple apparatus arrangement, which can prevent suction holes from being printed on a substrate during a coating process, and can decrease particles attaching to the lower surface of the substrate, and further to provide a coating system which uses the stage apparatus.

As a technique to solve the above problems, the present inventors previously studied an apparatus which, while transferring a glass substrate in an almost horizontal posture without chucking and holding it on a stage, supplies a resist liquid onto the surface of the glass substrate to form a coating film. This resulted in patent applications concerning a processing apparatus of a levitation substrate transfer type configured to apply a resist liquid onto the surface of a substrate while transferring the substrate by levitation (Japanese Patent Application Nos. 2004-4330 and 2004-28156).

A substrate levitating stage used in the processing apparatus of a levitation substrate transfer type has gas spray ports for spraying a gas and suction ports. The gas spray amount and suction amount are balanced to levitate the substrate to a predetermined height from the stage surface. In this stage, the gas spray ports and suction ports are formed on straight lines at predetermined pitches in directions perpendicular to the substrate transfer direction. The gas spray ports and suction ports are formed at a predetermined pitch to alternate in the substrate transfer direction.

Where the suction ports are arranged in this manner, however, when transferring the substrate, the plurality of gas suction ports arranged in the direction perpendicular to the substrate transfer direction are opened simultaneously and take in a large amount of air. Then, the suction pressure may largely vary and change the levitation height of the substrate. A change in levitation height may vibrate the substrate. Accordingly, the levitation posture of the substrate may be degraded.

In general, a plurality of suction ports are formed in a substrate levitating stage and set to communicate with each other by a plurality of suction pipes connected to one manifold. A vacuum pump or the like connected to the manifold is operated to take in air from the suction ports. If the substrate transfer distance increases, the lengths of the suction pipes which connect the suction ports to the manifold increase. This may lower the response speed when a suction pressure load of the stage varies.

Where a large substrate is transferred or the substrate transfer length is large, a larger stage must be formed by arranging a plurality of small stages linearly parallel to each other. In this case, suction pipes provided to the respective small stages are connected to a manifold, and a vacuum pump or the like is connected to the manifold. With this arrangement, if the suction pressure load varies on one certain small stage, the variation is transmitted to the other stages through the manifold and lowers the response speed. Also, the pressure load variation is not sufficiently transmitted to the other stages from the beginning, so the suction pressure load varies within the surface of the large substrate transfer stage, thus decreasing the flatness of the substrate during substrate transfer.

The present invention can achieve the above object without causing the above problems.

According to a first aspect of the present invention, there is provided a stage apparatus comprising a stage over which a rectangular substrate is to be transferred and a levitation mechanism which levitates the rectangular substrate over the stage, the rectangular substrate which is levitated over the stage being transferred such that a pair of sides of the rectangular substrate are substantially parallel to a transfer direction and the other pair of sides of the rectangular substrate are substantially perpendicular to the transfer direction, wherein the stage includes a plurality of gas spray ports to spray a gas and a plurality of suction ports to attract the rectangular substrate by suction, the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, and said plurality of suction ports are arranged on the stage such that, when the rectangular substrate is being transferred over the stage, a leading end of the rectangular substrate in the transfer direction does not simultaneously cover not less than a predetermined number of suction ports and a trailing end of the rectangular substrate in the transfer direction does not simultaneously open not less than a predetermined number of suction ports to the atmosphere, so as for variations in suction pressure in the suction ports to fall within an allowable range.

The stage apparatus according to the first aspect may be arranged such that the suction ports are formed at a predetermined pitch in the transfer direction of the rectangular substrate and at a predetermined pitch in a direction shifting from a direction perpendicular to the transfer direction by a predetermined angle.

According to a second aspect of the present invention, there is provided a stage apparatus comprising a stage over which a substrate is to be transferred and a levitation mechanism which levitates the substrate over the stage, wherein the stage includes a plurality of gas spray ports to spray a gas and a plurality of suction ports to take in air to attract the substrate, the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes a predetermined number of pipe portions each of which allows a predetermined number of said plurality of suction ports to communicate with each other, one manifold which allows the predetermined number of pipe portions to communicate with each other, a suction device which is connected to the manifold to take in air from said plurality of suction ports via the manifold, and a hole portion which is formed in the pipe portion near the suction port and open to the atmosphere to increase a speed to respond to variations in suction pressure when the substrate is transferred by levitation over the stage.

The stage apparatus according to the second aspect may be arranged such that the pipe portions include a first pipe portion to allow the predetermined number of suction ports to communicate with each other in the stage, and a second pipe portion to connect the first pipe portion to the manifold, and the hole portion is formed in any one of a portion of the second pipe portion near the stage, and the first pipe portion.

According to a third aspect of the present invention, there is provided a stage apparatus comprising a stage over which a substrate is to be transferred and a levitation mechanism which levitates the substrate over the stage, wherein the stage comprises a plurality of small stages each including a plurality of gas spray ports to spray a gas and a plurality of suction ports to take in air to attract a rectangular substrate, the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes a plurality of pipe portions each of which allows said plurality of suction ports provided to each of said plurality of small stages to communicate with each other, a manifold to allow said plurality of pipe portions to communicate with each other, a suction device which is connected to the manifold to take in air from said plurality of suction ports provided to each of said plurality of small stages via the manifold, and a bypass pipe which allows said plurality of pipe portions to communicate with each other, so as for fluctuations in suction pressures among said plurality of small stages to decrease.

The stage apparatus according to the third aspect may be arranged such that the pipe portions respectively provided to said plurality of small stages include a plurality of branch pipes which allow a predetermined number of said plurality of suction ports provided to each of said plurality of small stages to communicate with each other, and said plurality of branch pipes connect to the manifold, and the bypass pipe allows said plurality of branch pipes respectively provided to said plurality of small stages to communicate with each other.

The stage apparatus according to the third aspect may be arranged such that said plurality of small stages line up in a transfer direction of the substrate and in a direction perpendicular to the transfer direction, and the bypass pipe allows pipe portions of the respective small stages to communicate with each other in the transfer direction of the substrate and a direction perpendicular to the transfer direction.

According to a fourth aspect of the present invention, there is provided a stage apparatus comprising a stage over which a rectangular substrate is to be transferred and a levitation mechanism which levitates the rectangular substrate over the stage, the rectangular substrate which is levitated over the stage being transferred such that a pair of sides of the rectangular substrate are substantially parallel to a transfer direction and the other pair of sides of the rectangular substrate are substantially perpendicular to the transfer direction, wherein the stage comprises a plurality of small stages each including a plurality of gas spray ports to spray a gas and a plurality of suction ports to attract the rectangular substrate by suction, the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, the suction mechanism includes a plurality of pipe portions each of which allows said plurality of suction ports provided to each of said plurality of small stages to communicate with each other, a hole portion which is formed in the pipe portion near the suction port and open to the atmosphere to increase a speed to respond to variations in suction pressure when the rectangular substrate is transferred by levitation over the stage, a manifold to allow said plurality of pipe portions to communicate with each other, a suction device which is connected to the manifold to take in air from said plurality of suction ports provided to each of said plurality of small stages via the manifold, and a bypass pipe which allows said plurality of pipe portions to communicate with each other, so as for fluctuations in suction pressures among said plurality of small stages to decrease, and wherein said plurality of suction ports are arranged on each of the small stages such that, when the transfer mechanism transfers the rectangular substrate over the stage, a leading end of the rectangular substrate in the transfer direction does not simultaneously cover not less than a predetermined number of suction ports and a trailing end of the rectangular substrate in the transfer direction does not simultaneously open not less than a predetermined number of suction ports to the atmosphere, so as for variations in suction pressure in the suction ports to fall within an allowable range.

According to a fifth aspect of the present invention, there is provided a coating system which applies a coating liquid to a rectangular substrate to form a coating film while transferring the rectangular substrate, the system comprising: a stage apparatus including a stage over which the rectangular substrate is to be transferred and a levitation mechanism which levitates the rectangular substrate over the stage; a substrate transfer mechanism which transfers the rectangular substrate levitated over the stage such that a pair of sides of the rectangular substrate are substantially parallel to a transfer direction and the other pair of sides of the rectangular substrate are substantially perpendicular to the transfer direction; and a coating mechanism which applies the coating liquid to a surface of the rectangular substrate which is being transferred over the stage by the substrate transfer mechanism, wherein the stage includes a plurality of gas spray ports to spray a gas and a plurality of suction ports to attract the rectangular substrate by suction, the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, and the suction ports are arranged on the stage such that, when the transfer mechanism transfers the rectangular substrate over the stage, a leading end of the rectangular substrate in the transfer direction does not simultaneously cover not less than a predetermined number of suction ports and a trailing end of the rectangular substrate in the transfer direction does not simultaneously open not less than a predetermined number of suction ports to the atmosphere, so as for variations in suction pressure in the suction ports to fall within an allowable range.

According to a sixth aspect of the present invention, there is provided a coating system which applies a coating liquid to a substrate to form a coating film while transferring the substrate, the system comprising: a stage apparatus including a stage over which the substrate is to be transferred and a levitation mechanism which levitates the substrate over the stage; a substrate transfer mechanism which transfers the substrate levitated over the stage; and a coating mechanism which applies the coating liquid to a surface of the substrate which is being transferred over the stage by the substrate transfer mechanism, wherein the stage includes a plurality of gas spray ports to spray a gas and a plurality of suction ports to take in air to attract the substrate, the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes a predetermined number of pipe portions each of which allows a predetermined number of said plurality of suction ports to communicate with each other, one manifold which allows the predetermined number of pipe portions to communicate with each other, a suction device which is connected to the manifold to take in air from said plurality of suction ports via the manifold, and a hole portion which is formed in the pipe portion near the suction port and open to the atmosphere to increase a speed to respond to variations in suction pressure when the substrate is transferred by levitation over the stage.

According to a seventh aspect of the present invention, there is provided a coating system which applies a coating liquid to a substrate to form a coating film while transferring the substrate, the system comprising: a stage apparatus including a stage over which the substrate is to be transferred and a levitation mechanism which levitates the substrate over the stage; a substrate transfer mechanism which transfers the substrate levitated over the stage; and a coating mechanism which applies the coating liquid to a surface of the substrate which is being transferred over the stage by the substrate transfer mechanism, wherein the stage comprises a plurality of small stages each including a plurality of gas spray ports to spray a gas and a plurality of suction ports to take in air to attract the substrate, the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes a plurality of pipe portions each of which allows said plurality of suction ports, provided to each of said plurality of small stages, to communicate with each other, a manifold to allow said plurality of pipe portions to communicate with each other, a suction device which is connected to the manifold to take in air from said plurality of suction ports, provided to each of said plurality of small stages, via the manifold, and a bypass pipe which allows said plurality of pipe portions to communicate with each other, so as for fluctuations in suction pressures among said plurality of small stages to decrease.

According to an eighth aspect of the present invention, there is provided a coating system which applies a coating liquid to a rectangular substrate to form a coating film while transferring the rectangular substrate, the system comprising: a stage apparatus including a stage over which the rectangular substrate is to be transferred and a levitation mechanism which levitates the rectangular substrate over the stage; a substrate transfer mechanism which transfers the rectangular substrate levitated over the stage such that a pair of sides of the rectangular substrate are substantially parallel to a transfer direction and the other pair of sides of the rectangular substrate are substantially perpendicular to the transfer direction; and a coating mechanism which applies the coating liquid to a surface of the rectangular substrate which is being transferred over the stage by the substrate transfer mechanism, wherein the stage comprises a plurality of small stages each including a plurality of gas spray ports to spray a gas and a plurality of suction ports to attract the rectangular substrate by suction, the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, the suction mechanism includes a plurality of pipe portions each of which allows said plurality of suction ports provided to each of said plurality of small stages to communicate with each other, a hole portion which is formed in the pipe portion near the suction port and open to the atmosphere to increase a speed to respond to variations in suction pressure when the rectangular substrate is transferred by levitation over the stage, a manifold to allow said plurality of pipe portions to communicate with each other, a suction device which is connected to the manifold to take in air from said plurality of suction ports provided to each of said plurality of small stages via the manifold, and a bypass pipe which allows said plurality of pipe portions to communicate with each other, so as for fluctuations in suction pressures among said plurality of small stages to decrease, and wherein said plurality of suction ports are arranged on each of the small stages such that, when the transfer mechanism transfers the rectangular substrate over the stage, a leading end of the rectangular substrate in the transfer direction does not simultaneously cover not less than a predetermined number of suction ports and a trailing end of the rectangular substrate in the transfer direction does not simultaneously open not less than a predetermined number of suction ports to the atmosphere, so as for variations in suction pressure in the suction ports to fall within an allowable range.

In any of the above arrangements, gas spray ports formed in a stage may be arranged in the same manner as suction ports, and pipes connected to the gas spray ports may have the same arrangement as that of the pipes connected to the suction ports. Then, even if a force to support a substrate by levitation varies, the posture of the substrate can be maintained well.

According to the present invention, suction ports are arranged on a stage such that, when a rectangular substrate is transferred over the stage, the leading end of the rectangular substrate in the transfer direction does not simultaneously cover a predetermined number of suction ports or more and the trailing end of the rectangular substrate in the transfer direction does not simultaneously open a predetermined number of suction ports or more, so variations in suction pressure of the suction ports falls within an allowable range. This can suppress variations in suction pressure load. Also, hole portions that are open to the atmosphere are formed in the vicinities of the suction ports of a predetermined number of pipe portions each of which allows a predetermined number of suction ports to communicate with each other, so that the speed to respond to the variations in suction pressure, occurring when transferring the substrate over the stage by levitation, increases. Then, when the suction pressure load changes, it can be coped with quickly. Also, a bypass pipe which allows the plurality of pipe portions to communicate with each other is provided so that fluctuations in suction pressure among the plurality of small stages decrease. This can improve the planar uniformity of the suction pressure. In a coating film forming system comprising such a stage apparatus, the levitation height and posture of the substrate are maintained highly accurately, so that a coating film with a uniform thickness can be formed.

BEST MODE FOR CARRYING OUT THE INVENTION

An embodiment of the present invention will be described in detail with reference to the accompanying drawing. A case will be described in which the present invention is applied to an apparatus and a method of forming a resist film on the surface of a glass substrate for an LCD (to be described as an "LCD substrate" hereinafter).

Figure 1:
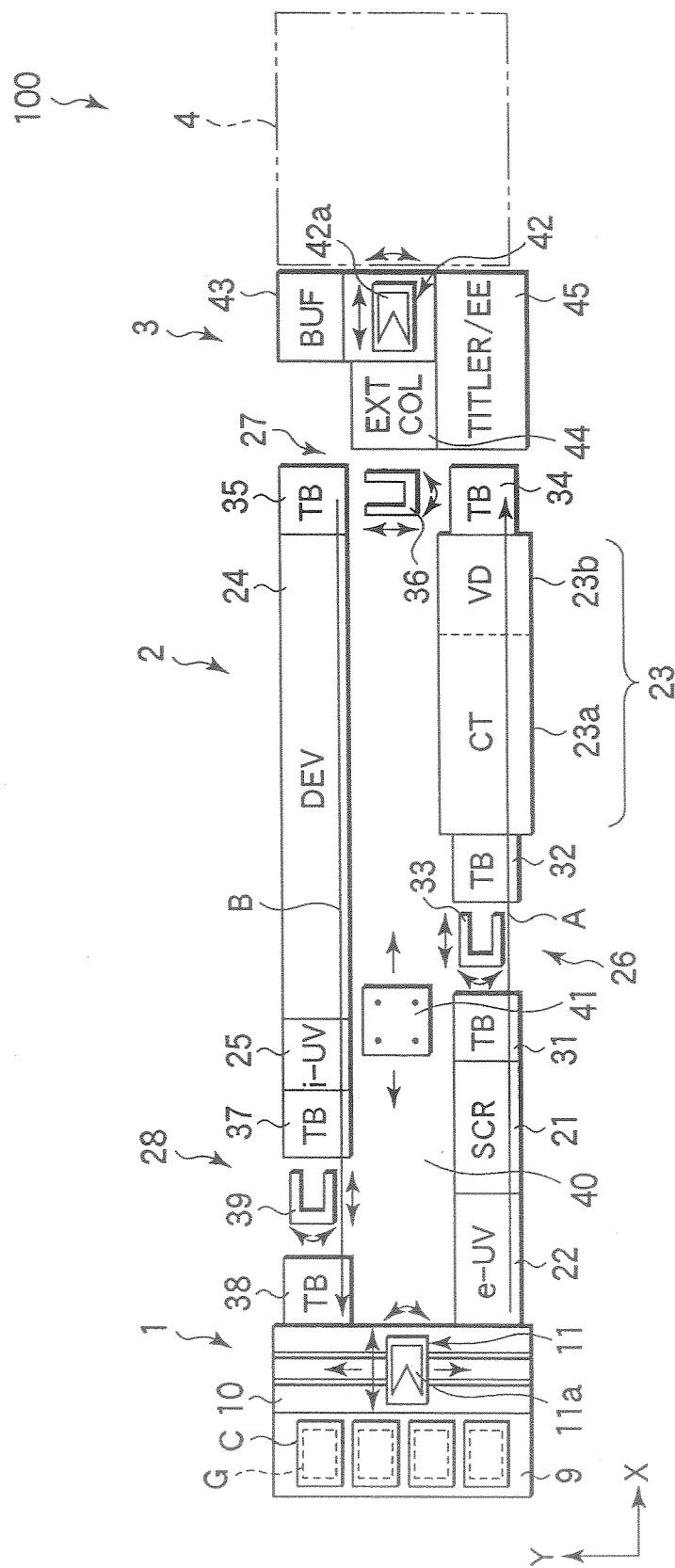
FIG. 1 is a schematic plan view of a resist coating/developing system including a resist coating unit according to one embodiment of the present invention.

FIG. 1 is a schematic plan view of a resist coating/developing system including a resist coating unit according to one embodiment of the present invention and configured to form a resist film on an LCD substrate and develop the resist film after light exposure.

This resist coating/developing system 100 comprises a cassette station (loading/unloading portion) 1 on which cassettes C accommodating a plurality of LCD substrates G are placed, a processing station (processing portion) 2 comprising a plurality of processing units to subject the LCD substrate G to a series of processes including resist application and development, and an interface station (interface portion) 3 to transfer the LCD substrate G with respect to an light exposure apparatus 4. The cassette station 1 and interface station 3 are respectively arranged at the two ends of the processing station 2. In FIG. 1, the longitudinal direction of the resist coating/developing system 100 is defined as an X-direction, and that direction on a plane which is perpendicular to the X-direction is defined as a Y-direction.

The cassette station 1 comprises a stage 9 on which the cassettes C can be placed to line up in the Y-direction, and a transfer apparatus 11 to load/unload the LCD substrate G with respect to the processing station 2. The cassettes C are transferred between the stage 9 and an external system. The transfer apparatus 11 has a transfer arm 11a and can move on a transfer path 10 formed along the Y-direction along which the cassettes C are arranged. The transfer arm 11a transfers the LCD substrate G between the cassettes C and processing station 2.

The processing station 2 has two parallel transfer lines A and B which basically extend in the X-direction to transfer the LCD substrate G. Along the transfer line A, a scrub-cleaning unit (SCR) 21, a first thermal processing unit section 26, a resist coating unit 23, and a second thermal processing unit section 27 are arranged from the cassette station 1 side toward the interface station 3.

Along the transfer line B, the second thermal processing unit section 27, a developing unit (DEV) 24, an i-line UV emitting unit (i-UV) 25, and a third thermal processing unit section 28 are arranged from the interface station 3 side toward the cassette station 1. An excimer UV emitting unit (e-UV) 22 is provided on part of the scrub-cleaning unit 21. The excimer UV emitting unit 22 is provided to remove organic substances on the LCD substrate G prior to scrubber cleaning. The i-line UV emitting unit 25 is provided to decolor the developed substrate G.

In the scrub-cleaning unit 21, the LCD substrate G is cleaned and dried while being transferred in the almost horizontal posture. In the developing unit 24, developing solution application, rinsing, and drying processes are sequentially performed while transferring the LCD substrate G in the almost horizontal posture. In each of the scrub-cleaning unit 21 and developing unit 24, for example, the LCD substrate G is transferred by roller conveyance or belt conveyance, and a loading port and an unloading port for the LCD substrate G are provided to the opposing short sides. A mechanism similar to the transfer mechanism of the developing unit 24 continuously transfers the LCD substrate G to the i-line UV emitting unit 25.

As will be described later in detail, the resist coating unit 23 comprises a resist coating mechanism (CT) 23a which supplies a resist liquid to form a coating film while transferring the LCD substrate G in the almost horizontal posture, and a reduced pressure drying mechanism (VD) 23b which exposes the LCD substrate G to a reduced pressure atmosphere to vaporize volatile components contained in the coating film formed on the LCD substrate G so as to dry the coating film.

The first thermal processing unit section 26 has two thermal processing unit blocks (TB) 31 and 32 each formed by stacking thermal processing units for thermally processing the LCD substrate G. The thermal processing unit block 31 is provided to the scrub-cleaning unit 21 side, and the thermal processing unit block 32 is provided to the resist coating unit 23 side. A first transfer apparatus 33 is arranged between the two thermal processing unit blocks 31 and 32.

Figure 2:
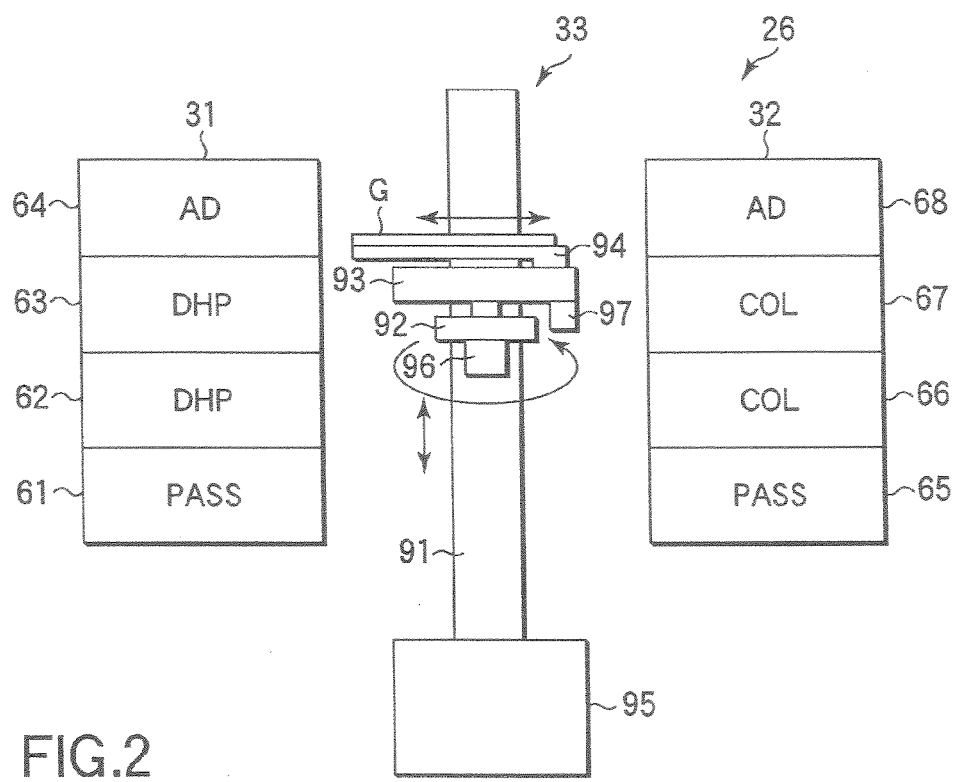
FIG. 2 is a side view showing a first thermal processing unit section in the resist coating/developing system in FIG. 1.

As shown in the side view of the first thermal processing unit section 26 of FIG. 2, in the thermal processing unit block 31, a pass unit (PASS) 61 for transferring the LCD substrate G, two dehydration baking units (DHP) 62 and 63 which dehydrate and bake the LCD substrate G, and an adhesion unit (AD) 64 which subjects the LCD substrate G to a hydrophobic process are sequentially stacked upward to form four stages. In the thermal processing unit block 32, a pass unit (PASS) 65 for transferring the LCD substrate G, two cooling units (COL) 66 and 67 which cool the LCD substrate G, and an adhesion unit (AD) 68 which subjects the LCD substrate G to a hydrophobic process are sequentially stacked upward to form four stages.

The first transfer apparatus 33 receives the LCD substrate G from the scrub-cleaning unit 21 via the pass unit 61, transfers the LCD substrate G between the thermal processing units, and transfers the LCD substrate G to the resist coating unit 23 via the pass unit 65.

The first transfer apparatus 33 has a guide rail 91 extending vertically, an elevating member 92 which moves vertically along the guide rail 91, a base member 93 provided to be rotatable on the elevating member 92, and a substrate holding arm 94 provided to be movable forward/backward on the base member 93 and to hold the LCD substrate G. A motor 95 elevates the elevating member 92. A motor 96 rotates the base member 93. A motor 97 moves the substrate holding arm 94 forward/backward. In this manner, the first transfer apparatus 33 is movable vertically and forward/backward, and rotatable, and can access any unit in the thermal processing unit blocks 31 and 32.

The second thermal processing unit section 27 has two thermal processing unit blocks (TB) 34 and 35 each formed by stacking thermal processing units which thermally process the LCD substrate G. The thermal processing unit block 34 is provided to the resist coating unit 23 side, and the thermal processing unit block 35 is provided to the developing unit 24 side. A second transfer apparatus 36 is arranged between the two thermal processing unit blocks 34 and 35.

Figure 3:
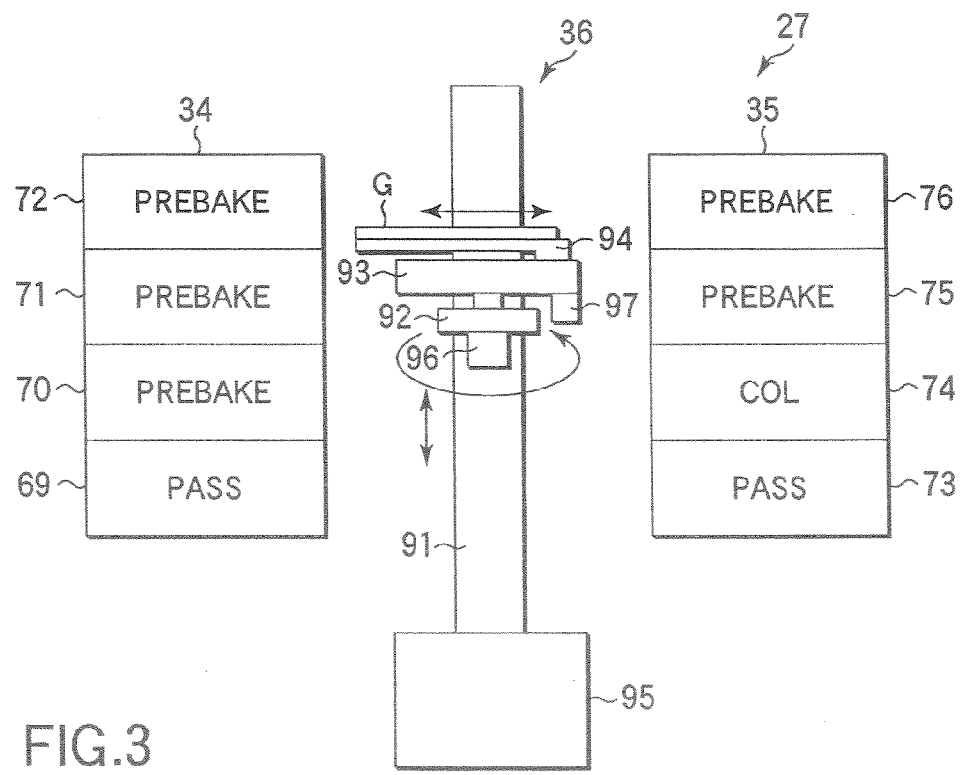
FIG. 3 is a side view showing a second thermal processing unit section in the resist coating/developing system in FIG. 1.

As shown in the side view of the second thermal processing unit section 27 of FIG. 3, in the thermal processing unit block 34, a pass unit (PASS) 69 for transferring the LCD substrate G, and three pre-baking units (PREBAKE) 70, 71, and 72 which pre-bake the LCD substrate G are sequentially stacked upward to form four stages. In the thermal processing unit block 35, a pass unit (PASS) 73 for transferring the LCD substrate G, a cooling unit (COL) 74 which cools the LCD substrate G, and two pre-baking units (PREBAKE) 75 and 76 which pre-bake the LCD substrate G are sequentially stacked upward to form four stages.

The second transfer apparatus 36 receives the LCD substrate G from the resist coating unit 23 via the pass unit 69, transfers the LCD substrate G between the thermal processing units, transfers the LCD substrate G to the developing unit 24 via the pass unit 73, and transfers and receives the LCD substrate G with respect to an extension cooling stage (EXT☐COL) 44 serving as the substrate transfer portion of the interface station 3 (to be described later). The second transfer apparatus 36 has the same structure as that of the first transfer apparatus 33 and can access any unit of the thermal processing unit blocks 34 and 35.

The third thermal processing unit section 28 has two thermal processing unit blocks (TB) 37 and 38 each formed by stacking thermal processing units which thermally process the LCD substrate G. The thermal processing unit block 37 is provided to the developing unit 24 side, and the thermal processing unit block 38 is provided to the cassette station 1 side. A third transfer apparatus 39 is arranged between the two thermal processing unit blocks 37 and 38.

Figure 4:
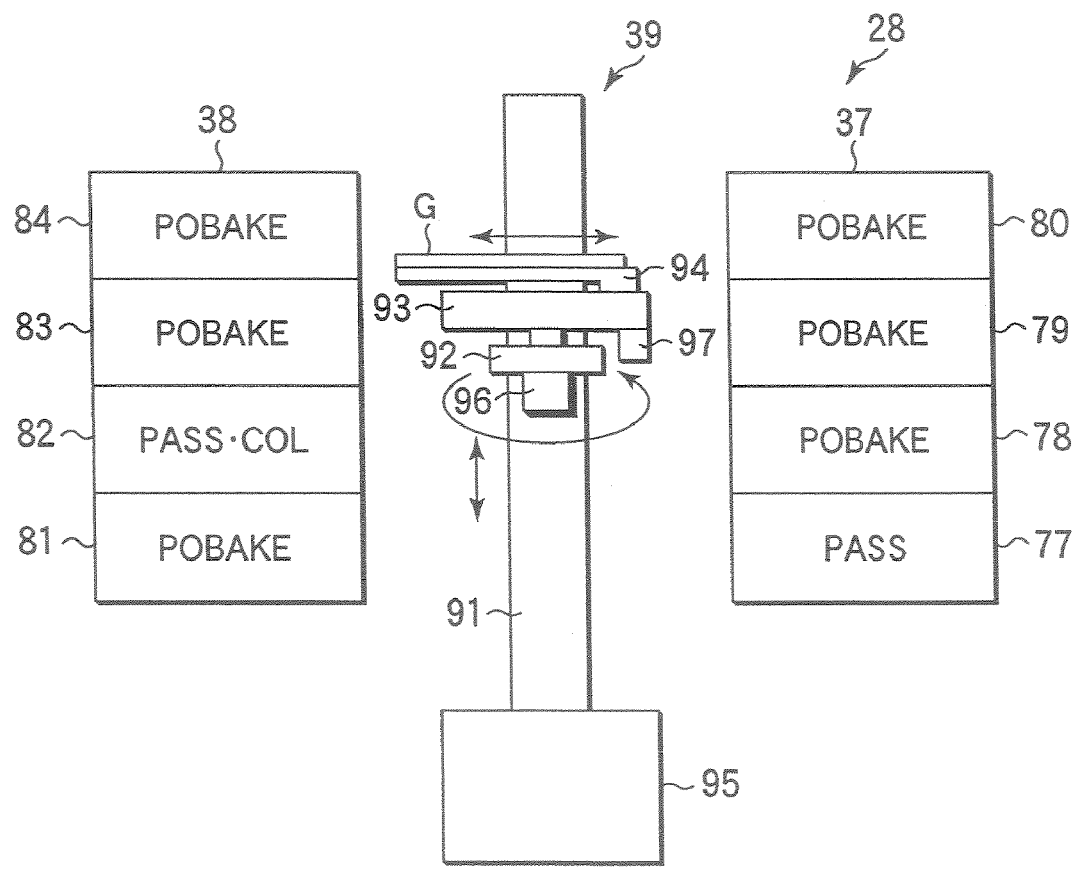
FIG. 4 is a side view showing a third thermal processing unit section in the resist coating/developing system in FIG. 1.

As shown in the side view of the third thermal processing unit section 28 of FIG. 4, in the thermal processing unit block 37, a pass unit (PASS) 71 for transferring the LCD substrate G, and three post-baking units (POBAKE) 78, 79, and 80 which post-bake the LCD substrate G are sequentially stacked upward to form four stages. In the thermal processing unit block 38, a post-baking unit (POBAKE) 81 which post-bakes the LCD substrate G, a pass/cooling unit (PASS☐COL) 82 for transferring and cooling the LCD substrate G, and two more post-baking units (POBAKE) 83 and 84 are sequentially stacked upward to form four stages.

The third transfer apparatus 39 receives the LCD substrate G from the i-line UV emitting unit 25 via the pass unit 77, transfers the LCD substrate G between the thermal processing units, and transfers the LCD substrate G to the cassette station 1 via the pass/cooling unit 82. The third transfer apparatus 39 also has the same structure as that of the first transfer apparatus 33, and can access any unit of the thermal processing unit blocks 37 and 38.

In the processing station 2, the respective processing units and transfer apparatuses are arranged to constitute the two transfer lines A and B as described above and to basically line up in the processing procedure. Space 40 is provided between the transfer lines A and B. A shuttle (substrate stage member) 41 is provided to be reciprocal through the space 40. The shuttle 41 can hold the LCD substrate G. The LCD substrate G is transferred between the transfer lines A and B via the shuttle 41. The first to third transfer apparatuses 33, 36, and 39 transfer the LCD substrate G with respect to the shuttle 41.

The interface station 3 has a transfer apparatus 42 which transfers the LCD substrate G between the processing station 2 and light exposure apparatus 4, a buffer stage (BUF) 43 where a buffer cassette is arranged, and the extension cooling stage 44 serving as a substrate transfer portion comprising a cooling function. An external unit block 45 in which a titler (TITLER) and a peripheral light exposure unit (EE) are vertically stacked is provided adjacent to the transfer apparatus

42. The transfer apparatus 42 comprises a transfer arm 42a. The transfer arm 42a transfers the LCD substrate G between the processing station 2 and light exposure apparatus 4.

In the resist coating/developing system 100 having the above arrangement, first, an LCD substrate G is transferred by the transfer apparatus 11 directly from a cassette C arranged on the stage 9 of the cassette station 1 into the excimer UV emitting unit 22 of the processing station 2, and subjected to a pre-scrub process. Subsequently, the LCD substrate G is transferred by the transfer apparatus 11 into the scrub-cleaning unit 21, and subjected to scrub-cleaning. After the scrub-cleaning process, the LCD substrate G is unloaded to the pass unit 61 of the thermal processing unit block 31, belonging to the first thermal processing unit section 26, by, e.g., roller conveyance.

The LCD substrate G arranged in the pass unit 61 is initially transferred to any one of the dehydration baking units 62 and 63 of the thermal processing unit block 31 and heated, and subsequently transferred to any one of the cooling units 66 and 67 of the thermal processing unit block 32 and cooled. After that, to fix the resist firmly, the LCD substrate G is transferred to any one of the adhesion unit 64 of the thermal processing unit block 31 and the adhesion unit 68 of the thermal processing unit block 32, and subjected to an adhesion process (hydrophobic process) by HMDS. After that, the LCD substrate G is transferred to any one of the cooling units 66 and 67 and cooled, and then transferred to the pass unit 65 of the thermal processing unit block 32. When performing this series of processes, the first transfer apparatus 33 performs the transfer process of the LCD substrate G entirely.

The LCD substrate G is transferred by a first substrate transfer arm 19a (to be described later) from inside the pass unit 65 into the resist coating unit 23. As will be described later in detail, in the resist coating mechanism 23a, the resist liquid is supplied to the LCD substrate G to form a coating film on it while transferring the LCD substrate G in the horizontal posture. After that, the reduced pressure drying mechanism 23b subjects the coating film to the reduced pressure drying process. Then, the LCD substrate G is transferred by a second substrate transfer arm 19b (to be described later) from the resist coating unit 23 to the pass unit 69 of the thermal processing unit block 34 which belongs to the second thermal processing unit section 27.

The LCD substrate G is transferred by the second transfer apparatus 36 from inside the pass unit 69 to any one of the pre-baking units 70, 71, and 72 of the thermal processing unit block 34 or any one of the pre-baking units 75 and 76 of the thermal processing unit block 35 and pre-baked. After that, the LCD substrate G is transferred to the cooling unit 74 of the thermal processing unit block 35 and cooled to a predetermined temperature. Then, the LCD substrate G is further transferred by the second transfer apparatus 36 to the pass unit 73 of the thermal processing unit block 35.

After that, the LCD substrate G is transferred by the second transfer apparatus 36 to the extension cooling stage 44 of the interface station 3. Where necessary, the LCD substrate G is transferred by the transfer apparatus 42 of the interface station 3 to the peripheral light exposure unit (EE) of the external unit block 45, and subjected to light exposure to remove the peripheral portion (unnecessary portion) of the resist film. Subsequently, the LCD substrate G is transferred by the transfer apparatus 42 to the light exposure apparatus 4, and the resist film on the LCD substrate G is subjected to light exposure with a predetermined pattern. The LCD substrate G may be temporarily accommodated in a buffer cassette on the buffer stage 43 and then transferred to the light exposure apparatus 4.

After the light exposure, the LCD substrate G is transferred by the transfer apparatus 42 of the interface station 3 into the titler (TITLER) on the upper stage of the external unit block 45 to record predetermined information on the LCD substrate G. Then, the LCD substrate G is transferred by the transfer apparatus 42 onto the extension cooling stage 44. Then, the LCD substrate G is transferred by the second transfer apparatus 36 from the extension cooling stage 44 to the pass unit 73 of the thermal processing unit block 35 which belongs to the second thermal processing unit section 27.

The LCD substrate G is transferred from the pass unit 73 to the developing unit 24 by, e.g., a roller conveyer mechanism extending from the pass unit 73 to the developing unit 24. In the developing unit 24, a developing solution is applied to the LCD substrate G while the substrate is being transferred in the horizontal posture. Then, the LCD substrate G is temporarily stopped and tilted by a predetermined angle to drop the developing solution from it. In this state, a rinsing solution is supplied to the LCD substrate G to clean off the developing solution. After that, the LCD substrate G is restored to the horizontal posture, and transfer is started again. Drying nitrogen gas or air is blown to the LCD substrate G to dry it.

After the developing process is ended, the LCD substrate G is transferred by a transfer mechanism, e.g., roller conveyer, continuous from the developing unit 24, to the i-line UV emitting unit 25, and subjected to a decoloring process. After that, the LCD substrate G is transferred by a roller conveyer mechanism in the i-line UV emitting unit 25 to the pass unit 77 of the thermal processing unit block 37 which belongs to the third thermal processing unit section 28.

Then, the LCD substrate G is transferred by the third transfer apparatus 39 from inside the pass unit 77 to any one of the post-baking units 78, 79, and 80 of the thermal processing unit block 37 or any one of the post-baking units 81, 83, and 84 of the thermal processing unit block 38 and post-baked. After that, the LCD substrate G is transferred to the pass/cooling unit 82 of the thermal processing unit block 38 and cooled to a predetermined temperature. Then, the LCD substrate G is accommodated into a predetermined cassettes C arranged on the cassette station 1 by the transfer apparatus 11 of the cassette station 1.

Figure 5:
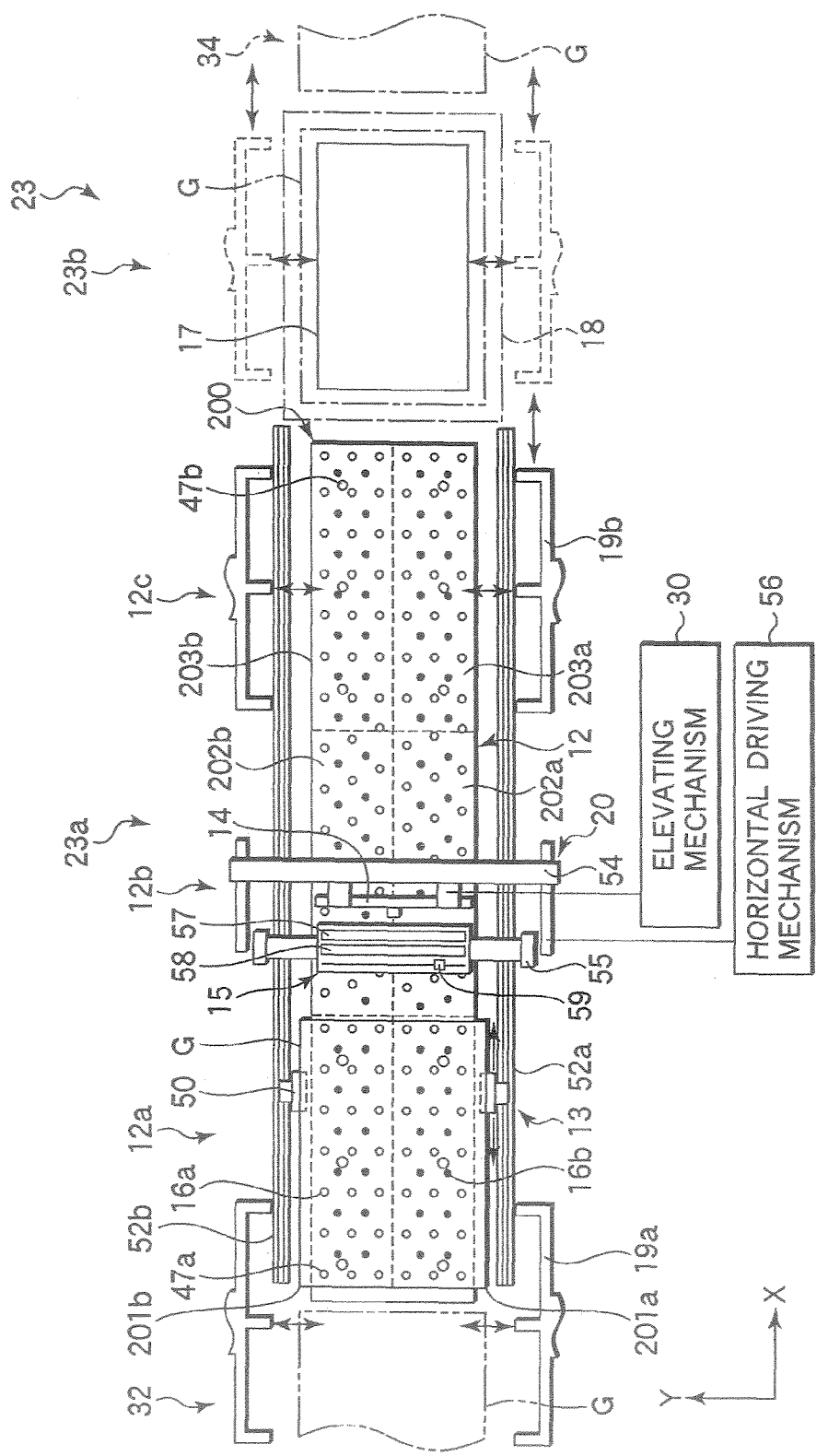
FIG. 5 is a schematic plan view showing the resist coating unit according to the embodiment of the present invention which is disposed in the resist coating/developing system in FIG. 1.

The resist coating unit 23 will now be described in detail. FIG. 5 is a schematic plan view showing the resist coating unit 23. The resist coating mechanism 23a comprises a stage apparatus 12 which has a stage 200 to transfer the LCD substrate G by levitation, a substrate transfer mechanism 13 which transfers the LCD substrate G on the stage apparatus 12 in the X-direction, a resist supply nozzle 14 which supplies the resist liquid onto the surface of the LCD substrate G under transfer over the stage 200 by levitation, and a nozzle cleaning unit 15 to clean the resist supply nozzle 14. To transfer the LCD substrate G from the pass unit 65 provided to the thermal processing unit block 32 to the resist coating mechanism 23a, the first substrate transfer arm 19a is disposed to be reciprocal between the pass unit 65 and resist coating unit 23. The first substrate transfer arm 19a is movable not only in the X-direction but also in the Y-direction and Z direction (vertical direction).

The reduced pressure drying mechanism 23b comprises a stage 17 where the LCD substrate G is to be placed, and a chamber 18 for accommodating the stage 17 and the LCD substrate G placed on the stage 17. To transfer via the reduced pressure drying mechanism 23b the LCD substrate G from the resist coating mechanism 23a to the pass unit 69 provided to the thermal processing unit block 34, the second substrate transfer arm 19b is disposed to be reciprocal between the resist coating unit 23 and pass unit 69. The second substrate transfer arm 19b is also movable not only in the X-direction but also in the Y-direction and Z direction.

The stage apparatus 12 is roughly divided into an introduction stage portion 12a, an application stage portion 12b, and an unloading stage portion 12c from upstream to downstream in the transfer direction of the LCD substrate G. The introduction stage portion 12a is an area to transfer the LCD substrate G from the pass unit 65 of the thermal processing unit block 32 to the application stage portion 12b. The resist supply nozzle 14 is arranged on the application stage portion 12b. On the application stage portion 12b, the resist liquid is supplied to the LCD substrate G to form a coating film on it. The unloading stage portion 12c is an area to unload the LCD substrate G having the coating film formed on it to the reduced pressure drying mechanism 23b.

As shown in FIG. 5, the stage 200 provided to the stage apparatus 12 has three small stages 201a, 202a, and 203a arranged in the X-direction, and three small stages 201b, 202b, and 203b arranged in the X-direction to be parallel to the three small stages 201a, 202a, and 203a. The small stages 201a and 201b are arranged on the introduction stage portion 12a. The small stages 202a and 202b are arranged on the application stage portion 12b. The small stages 203a and 203b are arranged on the unloading stage portion 12c.

Each of the small stages 201a to 203a and 201b to 203b has a large number of gas spray ports 16a to spray a predetermined gas (e.g., air or nitrogen gas) upward (in the Z direction), and a large number of suction ports 16b to take in air. By balancing the gas spray amount sprayed from the gas spray ports 16a with the intake air amount taken in from the suction ports 16b (namely, by setting the pressure load constant), the LCD substrate G can be levitated at a predetermined height from the surface of the small stage 201a or the like. By holding the Y-direction end of the LCD substrate G, which is levitated in this manner, with the substrate transfer mechanism 13, and moving the LCD substrate G in the Z direction, the LCD substrate G can be transferred by levitation. In FIG. 5, the gas spray ports 16a are expressed as white dots and the suction ports 16b are expressed as black dots to facilitate understanding of the arrangement of the gas spray ports 16a and suction ports 16b. FIG. 5 shows only some of the gas spray ports 16a and suction ports 16b to make the arrangement clear.

The small stages 202a and 202b which constitute the application stage portion 12b must be able to hold the LCD substrate G in the horizontal posture highly accurately, so that the resist film formed on the LCD substrate G has a uniform thickness. In contrast to this, as the introduction stage portion 12a before forming the coating film or the unloading stage portion 12c after forming the coating film, a stage with a posture control capacity for the LCD substrate G which is inferior to that of the application stage portion 12b can be employed. This is because even if the posture of the LCD substrate G changes slightly on the introduction stage portion 12a or unloading stage portion 12c, it does not largely adversely affect the properties of the resist film.

Hence, as shown in FIG. 5, as the small stages 201a, 201b, 203a, and 203b, an arrangement is used such that each of which has the gas spray ports 16a formed on straight lines at predetermined pitches in the X-direction and Y-direction and the suction ports 16b formed on straight lines at predetermined pitches in the X-direction and Y-direction. In contrast to this, the arrangement of the gas spray ports 16a and suction ports 16b on the small stages 202a and 202b is different from that on the small stages 201a, 201b, 203a, and 203b, because the former arrangement needs to improve the posture control ability for the LCD substrate G. The small stages 202a and 202b have the same arrangement. In the following description, the small stage 202a will be described in detail as an example.

Figure 6:
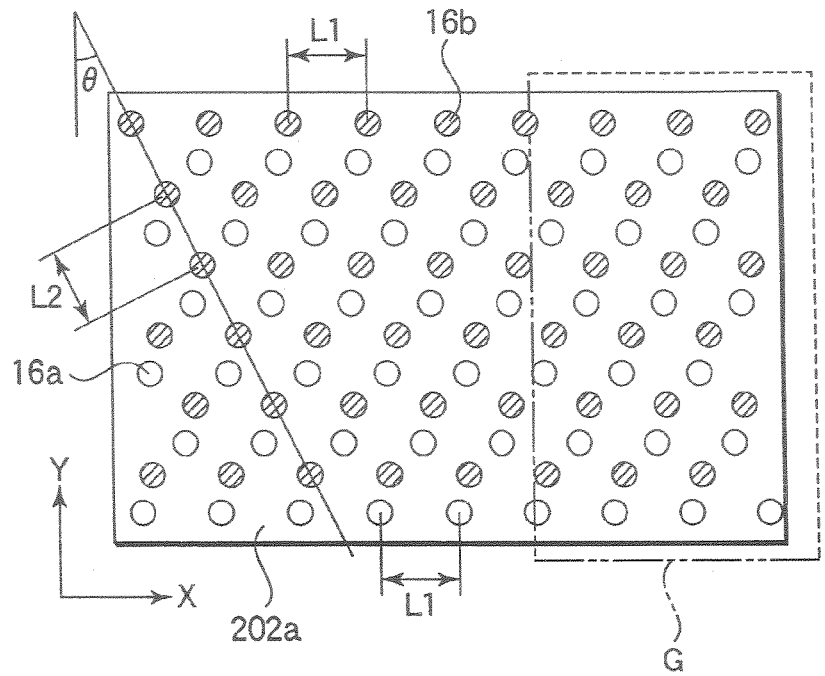
FIG. 6 is a plan view showing the schematic structure of a small stage (202a) provided to the resist coating unit shown in FIG. 5.

FIG. 6 is a plan view showing the schematic structure of the small stage 202a. In the small stage 202a, the large number of suction ports 16b are formed at a predetermined pitch L1 in the X-direction which is the transfer direction of the LCD substrate G, and at a predetermined pitch L2 in a direction shifting from the Y-direction, which is perpendicular to the X-direction, by a predetermined angle θ. Similarly, the large number of gas spray ports 16a are formed at the predetermined pitch L1 in the X-direction, and at the predetermined pitch L2 in a direction shifting from the Y-direction by the predetermined angle θ. In FIG. 6, the gas spray ports 16a and suction ports 16b are shown in enlargement to facilitate understanding of their arrangement. The gas spray ports 16a are expressed as white circles and the suction ports 16b are expressed as hatched circles so they are discriminated from each other.

The X-direction end faces (that is, the leading end and trailing end in the transfer direction) of the LCD substrate G are parallel to the Y-direction. In transfer of the LCD substrate G over the small stage 202a, if setting the pitches L1 and L2 and the angle θ appropriately, on the trailing end side of the LCD substrate G, the number of suction ports 16b opened to the atmosphere can be successively increased, and on the leading end side of the LCD substrate G, the number of suction ports 16b covered by the LCD substrate G can be successively decreased.

More specifically, when transferring the LCD substrate G over the small stage 202a, the X-direction end faces of the LCD substrate G are not simultaneously opened to the atmosphere (exposed), e.g., two or more suction ports 16b, and do not simultaneously cover the suction ports 16b. Thus, the suction pressure changes successively, so that sharp variations in the suction pressure can be avoided. As the variation in levitation height of the LCD substrate G over the stage 200 and vibration due to a change in levitation height can be suppressed in this manner, the thickness of the resist film can be uniformed.

In contrast to this, when transferring the LCD substrate G over the small stage 201a, on the trailing end side of the LCD substrate G, the number of suction ports 16b opened to the atmosphere changes stepwise, because an increase in suction ports 16b is repeated a predetermined number of times. On the leading end side of the LCD substrate G, the number of suction ports 16b covered by the LCD substrate G decreases stepwise, because a decrease in suction ports 16b is repeated a predetermined number of times. If the levitation height of the LCD substrate G over the stage 200 changes suddenly during application of the resist liquid, the thickness of the resist film changes. Therefore, the small stage 201a is not suitable to be arranged on the application stage portion 12b. Changes in suction pressure which are actually measured when transferring the LCD substrate G by levitation over the small stage 201a and transferring the LCD substrate G by levitation over the small stage 202a will be described later with reference to FIG. 11.

In the small stage 202a, the gas spray ports 16a are formed in the same manner as the suction ports 16b. Thus, during transfer of the LCD substrate G, the number of gas spray ports 16a opened to the atmosphere by the LCD substrate G increases successively, and the number of gas spray ports 16a covered by the LCD substrate G decreases successively. This can suppress the gas spray pressure from the gas spray ports 16a from changing suddenly. Variations in levitation height of the LCD substrate G over the stage 200 can be suppressed in this point of view as well, so that the thickness of the resist film can be uniformed. In the small stage 202a, it is also preferable to increase the number of gas spray ports 16a and that of the suction ports 16b. More specifically, regarding the arrangement of the gas spray ports 16a and suction ports 16b on the small stage 202a, the angle θ can be set to about 0.6°, the pitch L1 can be set to 10 mm, and the pitch L2 can be set to 10 mm.

The arrangement of the gas spray ports 16a and suction ports 16b on the small stage 202a is not limited to that shown in FIG. 6. The gas spray ports 16a and suction ports 16b can be arranged randomly as far as the leading end of the LCD substrate G in the transfer direction does not simultaneously cover a predetermined number of suction ports 16b or more and the trailing end of the LCD substrate G in the transfer direction does not simultaneously open a predetermined number of suction ports or more to the atmosphere. This is naturally based on the condition that the LCD substrate G can be held well in the horizontal state.

Figure 7:
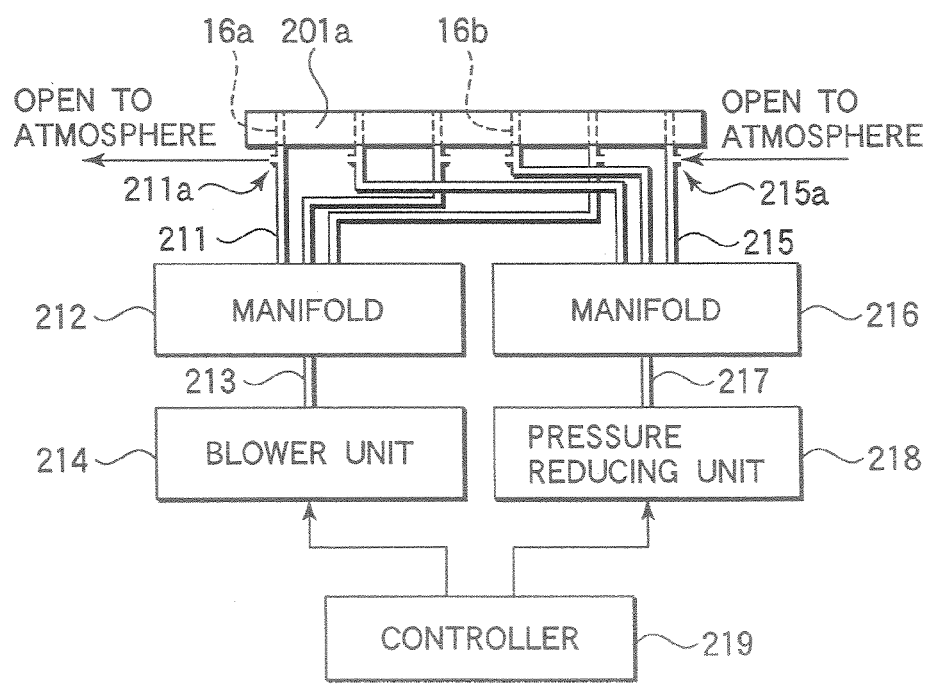
FIG. 7 is a piping diagram showing the schematic piping structure of a small stage (201a) provided to the resist coating unit shown in FIG. 5.

Air supply to the gas spray ports 16a and exhaust from the suction ports 16b, both formed in the stage 200, will be exemplified by the small stage 201a. FIG. 7 is a schematic piping diagram of the small stage 201a. Each branch pipe 211 allows a predetermined number, among the large number, of gas spray ports 16a (e.g., the gas spray ports 16a arranged in a line in the Y-direction) to communicate with each other. The plurality of branch pipes 211 attach to a manifold 212 and communicate with each other through the manifold 212. A blower unit 214, e.g., a blower, a gas cylinder, or a factory gas pipe facility, attaches to the manifold 212 through a main blower pipe 213. By actuating the blower unit 214, gas is sprayed from the gas spray ports 16a. Namely, the blower unit 214, manifold 212, main blower pipe 213, and the like constitute a gas spray mechanism.

Hole portions may be formed in the small stage 201a. Each hole portion may allow the predetermined number of gas spray ports 16a to communicate with each other, and the branch pipe 211 may attach to the hole portion. Where the number of gas spray ports 16a formed in the small stage 201a is small, one branch pipe 211 suffices.

Similarly, each branch pipe 215 allows a predetermined number, among the large number, of suction ports 16b to communicate with each other. The branch pipes 215 attach to a manifold 216 and communicate with each other through the manifold 216. A pressure reducing unit 218, e.g., an aspirator or a vacuum pump, attaches to the manifold 216 through a main blower pipe 217. By actuating the pressure reducing unit 218, air is taken in from the suction ports 16b. Namely, the pressure reducing unit 218 serves as a suction device. The pressure reducing unit 218, branch pipes 215, manifold 216, main blower pipe 217, and the like constitute a suction mechanism.

A controller 219 controls the air blowing volume of the blower unit 214 and the suction volume of the pressure reducing unit 218. This controls the gas spray pressure from the gas spray ports 16a and the suction pressure of the suction ports 16b to control the levitation height and levitation posture of the LCD substrate G.

Although FIG. 7 shows three branch pipes 211 and three branch pipes 215, the number of branch pipes 211 and that of branch pipes 215 are not limited to this.

Each branch pipe 211 and each branch pipe 215 respectively have small hole portions 211a and 215a, which are open to the atmosphere, near the small stage 201a (that is, near the corresponding suction ports 16b). The hole portions 211a and 215a may be respectively formed as pores so the hole portion 211a communicates with the gas spray port 16a and the hole portion 215a communicates with the suction port 16b in the small stage 201a.

By forming such hole portions 211a and 215a, the speed to respond to the variations in pressure load in the small stage 201a increases, and overshoot occurring when, e.g., the pressure load changes suddenly, can be suppressed. This can prevent the transfer height or the like of the LCD substrate G from changing, and the LCD substrate G from vibrating. The hole portions 211a and 215a need not be formed in all the branch pipes 211 and 215, but are preferably formed in pipes with particularly low pressure response speeds.

Figure 8:
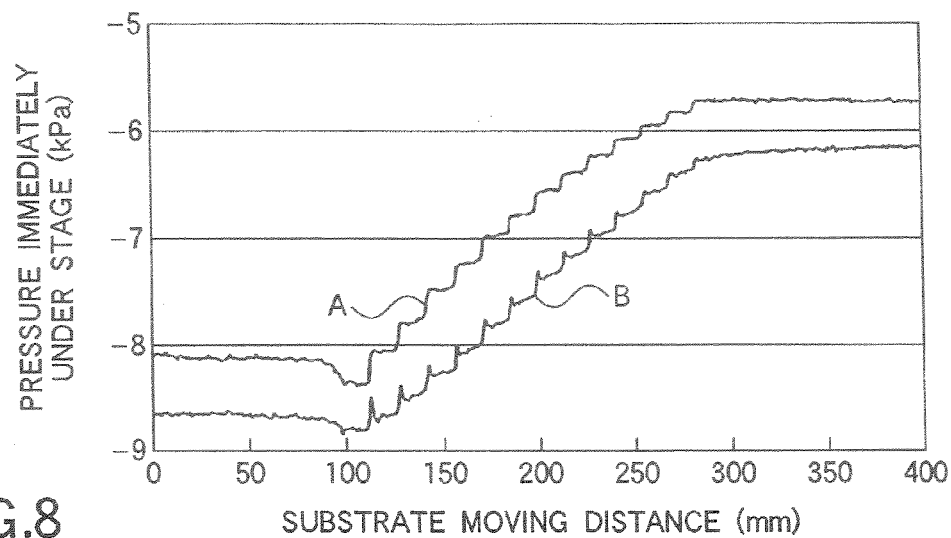
FIG. 8 is a graph showing a change in suction pressure of suction ports when transferring an LCD substrate G over the small stage (201a) provided to the resist coating unit shown in FIG. 5.

FIG. 8 is a graph showing a change in suction pressure (curve A) of the suction ports 16b when transferring the LCD substrate G over the small stage 201a having the hole portions 215a, and a change in suction pressure (curve B) of suction ports formed in a small stage, having the same structure as that of the small stage 201a except for having no hole portions 215a, when transferring the LCD substrate G over the small stage. The suction pressure in this case is the pressure in the branch pipes 215 immediately under the suction ports 16b. When transferring the LCD substrate G in the X-direction, the suction ports arranged in the Y-direction are opened simultaneously, so the suction pressure increases sharply. By forming the hole portions 215a, overshoot that occurs when the pressure changes suddenly is suppressed.

Figure 9:
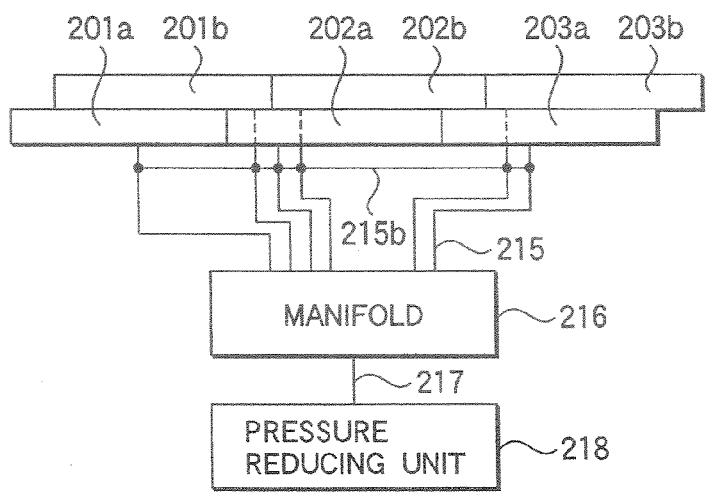
FIG. 9 is a diagram schematically showing the piping structure among the plurality of small stages provided to the resist coating unit.

The piping structure for the small stages 201a to 203a and 201b to 203b will be described. FIG. 9 is a diagram schematically showing the piping structure for the small stages 201a to 203a and 201b to 203b. The piping structure of the small stage 201a shown in FIG. 7 is applied to another stage. FIG. 9 shows only the branch pipes 215 which respectively communicate with the suction ports 16b of the small stages 201a to 203a and 201b to 203b. The branch pipes 211 which communicate with the gas spray ports 16a are not illustrated.

The branch pipes 215 communicate with each other via a bypass pipe 215b. Branch pipes which communicate with the other suction ports (not illustrated in FIG. 9) also communicate with each other via a bypass pipe which is not illustrated, and the branch pipes 211 which communicate with the gas spray ports 16a also communicate with each other via a bypass pipe which is not illustrated. When connecting the small stages 201a to 203a and 201b to 203b to constitute the large stage 200, the bypass pipe 215b as described above is provided. Thus, even if the pressure load to hold the LCD substrate G by levitation over a specific small stage changes suddenly, this change is transmitted to another small stage quickly via the bypass pipe 215b. This can uniform the forces of the small stages 201a to 203a and 201b to 203b to levitate the LCD substrate G. Hence, the LCD substrate G can be transferred in a stable posture.

Figure 10A:
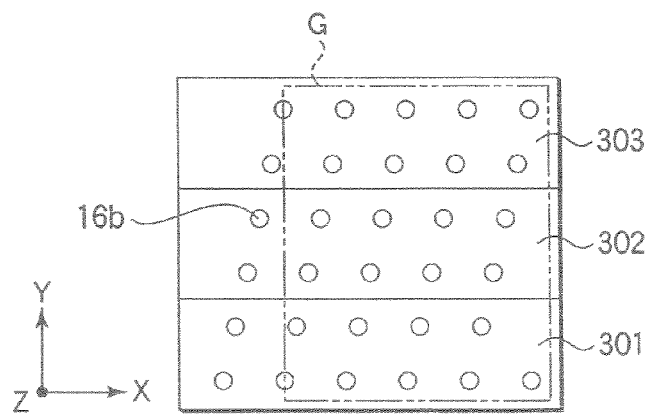
FIG. 10A is a plan view showing the arrangement of the suction ports on small stages prepared for an experiment.

FIG. 10A is a plan view showing the arrangement of suction ports 16b on small stages 301 to 303 prepared for an experiment. Although gas spray ports are not illustrated, their arrangement is similar to that of the suction ports 16b. When transferring an LCD substrate G by levitation in the X-direction in FIG. 10A, for example, the LCD substrate G sequentially covers the suction ports 16b formed in the small stages 301 to 303 in the order of the small stages 301, 302, and 303, and sequentially opens them to the atmosphere in the order of the small stages 301, 302, and 303.

Figure 10B:
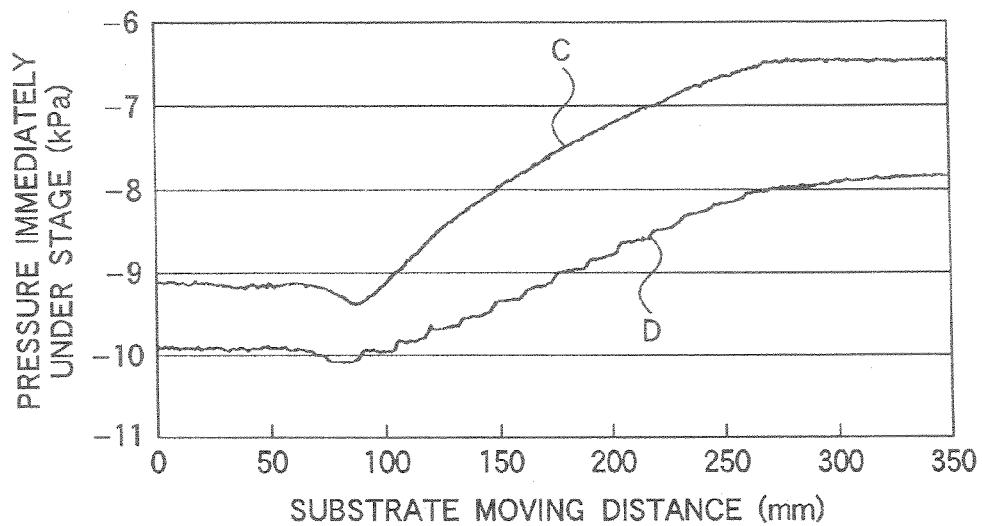
FIG. 10B is a graph showing a change in suction pressure of the suction ports when transferring the LCD substrate G over the small stages in FIG. 10A.

FIG. 10B is a graph showing a change in suction pressure (curve C) of the suction ports 16b when transferring the LCD substrate G by levitation in the X-direction over a small stage which is formed by providing the bypass pipe (shown in FIG. 9) to the branch pipes (not having the hole portions shown in FIG. 7 which are to be opened to the atmosphere) provided to the small stages 301 to 303, and a change in suction pressure (curve D) of the suction ports 16*b* when transferring the LCD substrate G over a stage which is formed without providing the bypass pipe (shown in FIG. 9) to the branch pipes provided to the small stages 301 to 303.

As indicated by the curve C, by providing the bypass pipe to the branch pipes, the suction pressures of the small stages 301 to 303 are uniformed. Thus, a change in suction pressure when opening the suction ports 16*b* to the atmosphere forms a slope. In contrast to this, as indicated by the curve D, when no bypass pipe is provided to the branch pipes, the respective branch pipes communicate with each other via the manifold and respond to a change in suction pressure. Hence, the response speed is low to appear as steps in the change in suction pressure.

Figure 11:
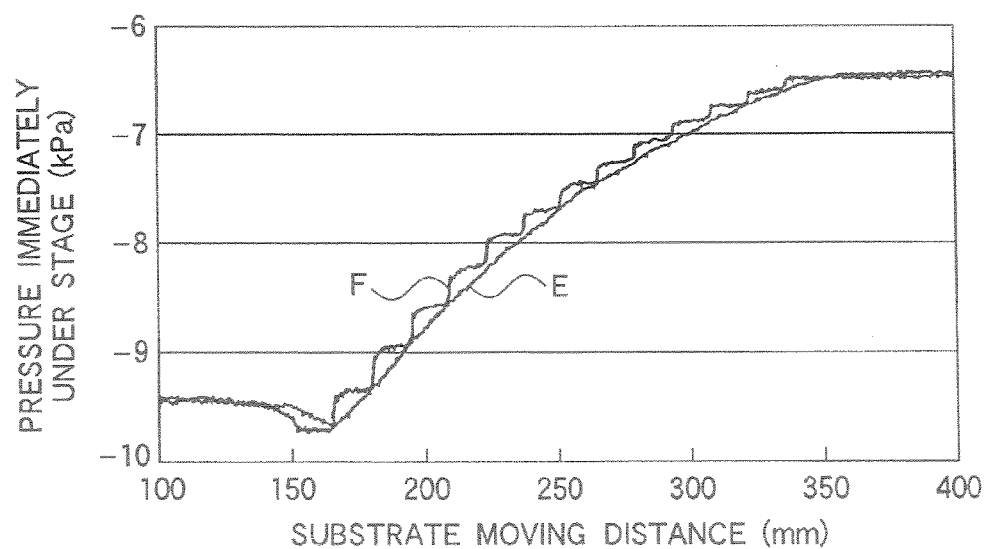
FIG. 11 is a graph showing a change in suction pressure as a function of a substrate moving distance when transferring the LCD substrate G over the small stage (202a, 202b) provided to the resist coating unit shown in FIG. 5, and a change in suction pressure as a function of a substrate moving distance when transferring the LCD substrate G over the small stage (201a, 201b).

FIG. 11 is a graph showing a change in suction pressure (curve E) when transferring the LCD substrate G over the small stages 202*a* and 202*b*, and a change in suction pressure (curve F) when transferring the LCD substrate G over the small stages 201*a* and 201*b*. Each of the small stages 202*a* and 202*b* has the gas spray ports 16*a* and suction ports 16*b* in the manner shown in FIG. 6. The branch pipes 215 have the hole portions 215*a* which are open to the atmosphere, as shown in FIG. 7. Also, the bypass pipe 215*b* is provided to the branch pipes 215 to allow them to communicate with each other, as shown in FIG. 9. Each of the small stages 201*a* and 201*b* has the gas spray ports 16*a* and suction ports 16*b* in the manner shown in FIG. 5. The branch pipes 215 have the hole portions 215*a* which are open to the atmosphere, as shown in FIG. 7. Also, the bypass pipe 215*b* is provided to the branch pipes 215 to allow them to communicate with each other, as shown in FIG. 9.

When using the small stages 201*a* and 201*b*, since the suction ports 16*b* arranged in the Y-direction are simultaneously opened to the atmosphere, the suction pressure changes stepwise, as indicated by the curve F. When the suction pressure rises sharply in this manner, the levitation height of the LCD substrate G tends to change suddenly. In contrast to this, when using the small stages 202*a* and 202*b*, since the suction ports 16*b* are successively opened to the atmosphere, the suction pressure changes successively in the form of a slope, as indicated by the curve E. This indicates that sharp variations can be avoided. Variations in levitation height of the LCD substrate G over the stage 200 can be suppressed in this manner, so that the thickness of the resist film can be uniformed.

The other portions that constitute the resist coating unit 23 will be described briefly. As shown in FIG. 5, the small stages 201*a* and 201*b* provided to the introduction stage portion 12*a* are provided with lift pins 47*a* to support the LCD substrate G which is transferred by the first substrate transfer arm 19*a* to the introduction stage portion 12*a* and to move the LCD substrate G downward to the small stages 201*a* and 201*b*. The small stages 203*a* and 203*b* provided to the unloading stage portion 12*c* are provided with lift pins 47*b* to lift the LCD substrate G which is transferred to the unloading stage portion 12*c* and to transfer the LCD substrate G to the second substrate transfer arm 19*b*.

The substrate transfer mechanism 13 comprises linear guides 52*a* and 52*b* which are arranged to extend in the X-direction on the Y-direction side surfaces of the stage 12, a slider 50 which fits with the linear guides 52*a* and 5*b*, an X axis driving mechanism (not shown), e.g., a belt driving mechanism or an air slider, to reciprocally move the slider 50 in the X-direction, and a substrate holding member (not shown), e.g., a suction pad, which is provided to the slider 50 to hold part of the Y-direction end of the LCD substrate G. For example, the suction pad holds the LCD substrate G in the vicinity of that Y-direction end of the lower surface of the LCD substrate G to which the resist liquid is not applied.

The resist supply nozzle 14 has an elongated shape which is long in one direction and discharges the resist liquid in the form of an almost band like shape which is long in the Y-direction. A nozzle moving mechanism 20 comprises an elevating mechanism 30 which holds the resist supply nozzle 14 such that its longitudinal direction coincides with the Y-direction and vertically moves the resist supply nozzle 14 in the Z direction, a pillar member 54 which holds the elevating mechanism 30, and a horizontal driving mechanism 56, e.g., a ball screw, to move the pillar member 54 in the X-direction. The nozzle moving mechanism 20 can move the resist supply nozzle 14 between a position to supply the resist liquid to the LCD substrate G and positions, e.g., a position where the LCD substrate G is to be cleaned in the nozzle cleaning unit 15.

The nozzle cleaning unit 15 attaches to a pillar member 55 and is arranged above the small stages 202*a* and 202*b*. The nozzle cleaning unit 15 comprises a dummy dispenser portion 57 to perform so called dummy dispensing which causes the resist supply nozzle 14 to preliminarily discharge the resist liquid before supplying the resist liquid to the LCD substrate G, a nozzle bath 58 to hold a resist discharge port in a vapor atmosphere of a solvent (e.g., a thinner) so the resist discharge port of the resist supply nozzle 14 will not be dried, and a nozzle cleaning mechanism 59 to remove the resist attaching to the vicinity of the resist discharge port of the resist supply nozzle 14.

The stage 17 provided to the reduced pressure drying mechanism 23*b* is provided with proximity pins (not shown), which support the LCD substrate G, at predetermined positions on its surface. The chamber 18 has a two split structure comprising a fixed lower container and a vertically movable upper lid.

A process for the LCD substrate G in the resist coating unit 23 having the above arrangement will be described. First, the slider 50 is set standby at a predetermined position (e.g., the thermal processing unit block 32 side) of the introduction stage portion 12*a*. The LCD substrate G can be levitated at a predetermined height at the respective portions of the stage apparatus 12. Subsequently, the LCD substrate G is held and transferred by the first substrate transfer arm 19*a* into the introduction stage portion 12*a* from the pass unit 65 provided to the thermal processing unit block 32. The lift pins 47*a* are moved upward to transfer the LCD substrate G from the first substrate transfer arm 19*a* to the lift pins 47*a*, and moved downward to transfer the LCD substrate G to the slider 50. Thus, the LCD substrate G is held by levitation in an almost horizontal posture over the small stages 201*a* and 201*b*.

When sliding the slider 50 toward the unloading stage portion 12*c* side at a predetermined speed, as the LCD substrate G passes under the resist supply nozzle 14 arranged in the application stage portion 12*b*, the resist supply nozzle 14 supplies the resist liquid to the surface of the LCD substrate G to form a coating film. The force that levitates the LCD substrate G while the LCD substrate G passes over the stage 200 is controlled in the manner as described above. This suppresses a sudden change in levitation height, vertical vibration, inclination from the horizontal posture, or the like of the LCD substrate G, so the LCD substrate G is transferred in a stable horizontal posture. Thus, a resist film having a uniform thickness can be formed.

Regarding the height to arrange the resist supply nozzle 14, as the LCD substrates G are usually transferred in practically the same state, the height of the resist supply nozzle 14 is adjusted in accordance with the LCD substrate G to be processed first, or a dummy substrate, and this position is stored in the control device of the elevating mechanism 30. The discharge start/end timing of the resist liquid from the resist supply nozzle 14 is determined utilizing a measurement signal of a sensor. Alternatively, another sensor that detects the position of the LCD substrate G may be provided, and the timing can be determined on the basis of a signal from this sensor.

The LCD substrate G on which the coating film is formed is transferred to the unloading stage portion 12c. The slider 50 releases the LCD substrate G, and the lift pins 47b are moved upward. Subsequently, the second substrate transfer arm 19b accesses the LCD substrate G lifted by the lift pins 47b. When the second substrate transfer arm 19b holds the LCD substrate G at the Y-direction ends of the LCD substrate G, the lift pins 47b are moved downward.

The second substrate transfer arm 19b places the held LCD substrate G onto the stage 17 of the reduced pressure drying mechanism 23b. After that, the chamber 18 is closed hermetically and its interior is pressure reduced to dry the coating film by pressure reduction. The slider 50 that has transferred the LCD substrate G to the lift pins 47b is returned to the thermal processing unit block 32 side to transfer an LCD substrate G to be processed next.

When the reduced pressure drying mechanism 23b ends the process for the LCD substrate G, the chamber 18 is opened. The second substrate transfer arm 19b accesses the LCD substrate G placed on the stage 17 and holds the LCD substrate G. The second substrate transfer arm 19b then transfers the LCD substrate G to the pass unit 69 of the thermal processing unit block 34.

After that, transfer of the LCD substrate G is repeated in the manner as described above to form the coating film on the LCD substrate G. During this period of time, the cleaning process of the resist supply nozzle 14 is performed appropriately as part of one set including, e.g., dummy dispensing by the dummy dispenser portion 57, formation of the resist film on the LCD substrate G, the cleaning process for the resist supply nozzle 14 by the nozzle cleaning mechanism 59, and suppression of drying of the resist discharge port by the nozzle bath 58.

The present invention is not limited to the above embodiments but can be changed in various manners. For example, in the above embodiment, the present invention is applied to the application stage portion 12b. However, the present invention may be applied to the introduction stage portion 12a and unloading stage portion 12c, in the same manner as to the application stage portion 12b. The posture control abilities of the introduction stage portion 12a and unloading stage portion 12c may be inferior to that of the application stage portion 12b. Thus, the suction ports 16b need not be formed but only the gas spray ports 16a may be formed. In this case, the gas spray ports 16a may be arranged to line up in a direction shifting from the Y-direction by a predetermined angle θ, in the same manner as in the small stages 202a and 202b which constitute the application stage portion 12b. In the above embodiment, the leading end in the transfer direction of the substrate does not simultaneously cover the plurality of suction ports, and its trailing end in the transfer direction does not simultaneously open the plurality of suction ports to the atmosphere. However, the plurality of suction ports may be simultaneously covered or opened to the atmosphere within a range where the variations in suction pressure do not increase. In the above description, a resist film was employed as the coating film. However, the coating film is not limited to a resist film, but can be an anti reflection film, a non photosensitive insulating film, or the like.

INDUSTRIAL APPLICABILITY

The present invention is suitably applied to a resist film formation apparatus or the like which forms a coating film such as a resist film on a large substrate such as an LCD glass substrate.

The invention claimed is:
1. A stage apparatus comprising:
a stage over which a rectangular substrate is to be transferred; and
a levitation mechanism which levitates the rectangular substrate over the stage, the rectangular substrate which is levitated over the stage being transferred such that a pair of sides of the rectangular substrate are substantially parallel to a transfer direction and the other pair of sides of the rectangular substrate are substantially perpendicular to the transfer direction,
wherein the stage includes a plurality of gas spray ports to spray a gas and a plurality of suction ports to attract the rectangular substrate by suction,
the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, and
said plurality of suction ports are arranged on the stage at a predetermined pitch in a predetermined direction shifting by a predetermined angle from a perpendicular direction perpendicular to the transfer direction and are arranged not to be aligned side by side in the perpendicular direction, such that, when the rectangular substrate is being transferred over the stage, the rectangular substrate is prevented from receiving sharp variations in suction pressure applied thereto.
2. The stage apparatus according to claim 1, wherein the suction ports are arranged at a certain pitch in the transfer direction and at the predetermined pitch in the predetermined direction.
3. The stage apparatus according to claim 1, wherein said plurality of gas spray ports are arranged on the stage at a first pitch in the transfer direction and at a second pitch in a direction shifting by a predetermined angle from the perpendicular direction and are arranged not to be aligned side by side in the perpendicular direction.
4. A stage apparatus comprising a stage over which a substrate is to be transferred and a levitation mechanism which levitates the substrate over the stage,
wherein the stage includes a plurality of gas spray ports to spray a gas and a plurality of suction ports to take in air to attract the substrate,
the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes
a predetermined number of pipe portions each of which allows a predetermined number of said plurality of suction ports to communicate with each other,
one manifold which allows the predetermined number of pipe portions to communicate with each other,
a suction device which is connected to the manifold to take in air from said plurality of suction ports via the manifold, and
hole portions respectively formed in the pipe portions near the suction ports and open to the atmosphere to increase a speed to respond to variations in suction pressure when the rectangular substrate is transferred by levitation over the stage.

5. The stage apparatus according to claim 4, wherein the pipe portions include a first pipe portion to allow the predetermined number of suction ports to communicate with each other in the stage, and a second pipe portion to connect the first pipe portion to the manifold.

6. The stage apparatus according to claim 4, wherein said plurality of suction ports are arranged on the stage at a certain pitch in the transfer direction and at a predetermined pitch in a direction shifting by a predetermined angle from a perpendicular direction perpendicular to the transfer direction and are arranged not to be aligned side by side in the perpendicular direction.

7. The stage apparatus according to claim 4, wherein said plurality of gas spray ports are arranged on the stage at a first pitch in the transfer direction and at a second pitch in a direction shifting by a predetermined angle from a perpendicular direction perpendicular to the transfer direction and are arranged not to be aligned side by side in the perpendicular direction.

8. A stage apparatus comprising a stage over which a substrate is to be transferred and a levitation mechanism which levitates the substrate over the stage,
wherein the stage comprises a plurality of small stages each including a plurality of gas spray ports to spray a gas and a plurality of suction ports to take in air to attract a rectangular substrate,
the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and
the suction mechanism includes
a plurality of pipe portions each of which allows said plurality of suction ports provided to each of said plurality of small stages to communicate with each other,
a manifold to allow said plurality of pipe portions to communicate with each other,
a suction device which is connected to the manifold to take in air from said plurality of suction ports provided to each of said plurality of small stages via the manifold, and
a bypass pipe which allows said plurality of pipe portions to communicate with each other, so as for fluctuations in suction pressures among said plurality of small stages to decrease.

9. The stage apparatus according to claim 8, wherein the pipe portions respectively provided to said plurality of small stages include a plurality of branch pipes which allow a predetermined number of said plurality of suction ports provided to each of said plurality of small stages to communicate with each other, and
said plurality of branch pipes connect to the manifold, and the bypass pipe allows said plurality of branch pipes respectively provided to said plurality of small stages to communicate with each other.

10. The stage apparatus according to claim 8, wherein said plurality of small stages line up in a transfer direction of the substrate and in a direction perpendicular to the transfer direction, and
the bypass pipe allows pipe portions of the respective small stages to communicate with each other in the transfer direction of the substrate and a direction perpendicular to the transfer direction.

11. The stage apparatus according to claim 8, wherein said plurality of suction ports are arranged on the stage at a certain pitch in the transfer direction and at a predetermined pitch in a direction shifting by a predetermined angle from a perpendicular direction perpendicular to the transfer direction and are arranged not to be aligned side by side in the perpendicular direction.

12. The stage apparatus according to claim 8, wherein said plurality of gas spray ports are arranged on the stage at a first pitch in the transfer direction and at a second pitch in a direction shifting by a predetermined angle from a perpendicular direction perpendicular to the transfer direction and are arranged not to be aligned side by side in the perpendicular direction.

13. A stage apparatus comprising a stage over which a rectangular substrate is to be transferred and a levitation mechanism which levitates the rectangular substrate over the stage, the rectangular substrate which is levitated over the stage being transferred such that a pair of sides of the rectangular substrate are substantially parallel to a transfer direction and the other pair of sides of the rectangular substrate are substantially perpendicular to the transfer direction,
wherein the stage comprises a plurality of small stages each including a plurality of gas spray ports to spray a gas and a plurality of suction ports to attract the rectangular substrate by suction,
the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports,
the suction mechanism includes
a plurality of pipe portions each of which allows said plurality of suction ports provided to each of said plurality of small stages to communicate with each other,
hole portions respectively formed in the pipe portions near the suction ports and open to the atmosphere to increase a speed to respond to variations in suction pressure when the rectangular substrate is transferred by levitation over the stage,
a manifold to allow said plurality of pipe portions to communicate with each other,
a suction device which is connected to the manifold to take in air from said plurality of suction ports provided to each of said plurality of small stages via the manifold, and a bypass pipe which allows said plurality of pipe portions to communicate with each other, so as for fluctuations in suction pressures among said plurality of small stages to decrease, and wherein said plurality of suction ports are arranged on each of the small stages such that, when the transfer mechanism transfers the rectangular substrate over the stage, a leading end of the rectangular substrate in the transfer direction does not simultaneously cover not less than a predetermined number of suction ports and a trailing end of the rectangular substrate in the transfer direction does not simultaneously open not less than a predetermined number of suction ports to the atmosphere.

14. The stage apparatus according to claim 13, wherein said plurality of suction ports are arranged on the stage at a certain pitch in the transfer direction and at a predetermined pitch in a direction shifting by a predetermined angle from a perpendicular direction perpendicular to the transfer direction and are arranged not to be aligned side by side in the perpendicular direction.

15. The stage apparatus according to claim 13, wherein said plurality of gas spray ports are arranged on the stage at a first pitch in the transfer direction and at a second pitch in a direction shifting by a predetermined angle from a perpendicular direction perpendicular to the transfer direction and are arranged not to be aligned side by side in the perpendicular direction.

16. A coating system which applies a coating liquid to a rectangular substrate to form a coating film while transferring the rectangular substrate, the system comprising:

a stage apparatus including a stage over which the rectangular substrate is to be transferred and a levitation mechanism which levitates the rectangular substrate over the stage;

a substrate transfer mechanism which transfers the rectangular substrate levitated over the stage such that a pair of sides of the rectangular substrate are substantially parallel to a transfer direction and the other pair of sides of the rectangular substrate are substantially perpendicular to the transfer direction; and a coating mechanism which applies the coating liquid to a surface of the rectangular substrate which is being transferred over the stage by the substrate transfer mechanism, wherein the stage includes a plurality of gas spray ports to spray a gas and a plurality of suction ports to attract the rectangular substrate by suction, the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, and the suction ports are arranged on the stage at a predetermined pitch in a predetermined direction shifting by a predetermined angle from a perpendicular direction perpendicular to the transfer direction and are arranged not to be aligned side by side in the perpendicular direction, such that, when the transfer mechanism transfers the rectangular substrate over the stage, the rectangular substrate is prevented from receiving sharp variations in suction pressure applied thereto.

17. A coating system which applies a coating liquid to a substrate to form a coating film while transferring the substrate, the system comprising:

a stage apparatus including a stage over which the substrate is to be transferred and a levitation mechanism which levitates the substrate over the stage;

a substrate transfer mechanism which transfers the substrate levitated over the stage; and a coating mechanism which applies the coating liquid to a surface of the substrate which is being transferred over the stage by the substrate transfer mechanism, wherein the stage includes a plurality of gas spray ports to spray a gas and a plurality of suction ports to take in air to attract the substrate, the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes a predetermined number of pipe portions each of which allows a predetermined number of said plurality of suction ports to communicate with each other, one manifold which allows the predetermined number of pipe portions to communicate with each other, a suction device which is connected to the manifold to take in air from said plurality of suction ports via the manifold, and hole portions respectively formed in the pipe portions near the suction ports and open to the atmosphere to increase a speed to respond to variations in suction pressure when the rectangular substrate is transferred by levitation over the stage.

18. A coating system which applies a coating liquid to a substrate to form a coating film while transferring the substrate, the system comprising:

a stage apparatus including a stage over which the substrate is to be transferred and a levitation mechanism which levitates the substrate over the stage;

a substrate transfer mechanism which transfers the substrate levitated over the stage; and a coating mechanism which applies the coating liquid to a surface of the substrate which is being transferred over the stage by the substrate transfer mechanism, wherein the stage comprises a plurality of small stages each including a plurality of gas spray ports to spray a gas and a plurality of suction ports to take in air to attract the substrate, the levitation mechanism includes a suction mechanism which takes in air through the suction ports and a gas spray mechanism which sprays the gas through the gas spray ports, and serves to levitate the substrate at a predetermined height from a surface of the stage in a substantially horizontal posture by means of suction of the suction mechanism through said plurality of suction ports and gas spray of the gas spray mechanism through said plurality of gas spray ports, and the suction mechanism includes a plurality of pipe portions each of which allows said plurality of suction ports, provided to each of said plurality of small stages, to communicate with each other, a manifold to allow said plurality of pipe portions to communicate with each other, a suction device which is connected to the manifold to take in air from said plurality of suction ports, provided to each of said plurality of small stages, via the manifold, and a bypass pipe which allows said plurality of pipe portions to communicate with each other, so as for fluctuations in suction pressures among said plurality of small stages to decrease.

19. A coating system which applies a coating liquid to a rectangular substrate to form a coating film while transferring the rectangular substrate, the system comprising:

a stage apparatus including a stage over which the rectangular substrate is to be transferred and a levitation mechanism which levitates the rectangular substrate over the stage;

a substrate transfer mechanism which transfers the rectangular substrate levitated over the stage such that a pair of sides of the rectangular substrate are substantially parallel to a transfer direction and the other pair of sides of the rectangular substrate are substantially perpendicular to the transfer direction; and a coating mechanism which applies the coating liquid to a surface of the rectangular substrate which is being transferred over the stage by the substrate transfer mechanism, wherein the stage comprises a plurality of small stages each including a plurality of gas spray ports to spray a gas and a plurality of suction ports to attract the rectangular substrate by suction, the levitation mechanism includes a suction mechanism which takes in air through the suction ports and a gas spray mechanism which sprays the gas through the gas spray ports, and serves to levitate the rectangular substrate at a predetermined height from a surface of the stage in a substantially horizontal posture by means of suction of the suction mechanism through said plurality of suction ports and gas spray of the gas spray mechanism through said plurality of gas spray ports, the suction mechanism includes a plurality of pipe portions each of which allows said plurality of suction ports provided to each of said plurality of small stages to communicate with each other, hole portions respectively formed in the pipe portions near the suction ports and open to the atmosphere to increase a speed to respond to variations in suction pressure when the rectangular substrate is transferred by levitation over the stage, a manifold to allow said plurality of pipe portions to communicate with each other, a suction device which is connected to the manifold to take in air from said plurality of suction ports provided to each of said plurality of small stages via the manifold, and a bypass pipe which allows said plurality of pipe portions to communicate with each other, so as for fluctuations in suction pressures among said plurality of small stages to decrease, and wherein said plurality of suction ports are arranged on each of the small stages such that, when the transfer mechanism transfers the rectangular substrate over the stage, a leading end of the rectangular substrate in the transfer direction does not simultaneously cover not less than a predetermined number of suction ports and a trailing end of the rectangular substrate in the transfer direction does not simultaneously open not less than a predetermined number of suction ports to the atmosphere.

* * * * *